(12) United States Patent
Kurita et al.

(10) Patent No.: US 7,612,987 B2
(45) Date of Patent: Nov. 3, 2009

(54) CHIP-TYPE FILTER

(75) Inventors: Junichi Kurita, Osaka (JP); Kenji Kuranuki, Kyoto (JP); Youichi Aoshima, Osaka (JP); Hiroshi Higashitani, Osaka (JP); Tsuyoshi Yoshino, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/368,569

(22) Filed: Feb. 10, 2009

(65) Prior Publication Data

US 2009/0154067 A1 Jun. 18, 2009

(51) Int. Cl.
*H01G 9/00* (2006.01)

(52) U.S. Cl. ........................ 361/523; 361/516; 361/519; 361/525; 361/528; 361/529

(58) Field of Classification Search ................ 361/523, 361/516–519, 525–528, 508–509, 306.1, 361/306.3; 29/25.01, 25.03
See application file for complete search history.

(56) References Cited

U.S. PATENT DOCUMENTS

| | | | |
|---|---|---|---|
| 6,236,561 B1 * | 5/2001 | Ogino et al. | 361/523 |
| 6,759,926 B2 * | 7/2004 | Yamaguchi | 333/175 |
| 6,836,401 B2 * | 12/2004 | Yoshida et al. | 361/538 |
| 6,920,037 B2 * | 7/2005 | Sano et al. | 361/540 |
| 7,057,882 B2 * | 6/2006 | Fujii et al. | 361/540 |
| 7,215,533 B2 | 5/2007 | Kurita et al. | |
| 7,411,775 B2 * | 8/2008 | Togashi | 361/303 |
| 7,468,881 B2 * | 12/2008 | Sato et al. | 361/306.3 |

| | | |
|---|---|---|
| 2002/0015277 A1 | 2/2002 | Nitoh et al. |
| 2002/0141141 A1 | 10/2002 | Nitoh et al. |

FOREIGN PATENT DOCUMENTS

| | | |
|---|---|---|
| JP | 60-41716 | 12/1985 |
| JP | 62-104435 | 7/1987 |
| JP | 2001-185460 | 7/2001 |
| JP | 2001-230156 | 8/2001 |
| JP | 2001-267141 | 9/2001 |
| JP | 2007-180327 | 7/2007 |
| WO | 2006/077906 | 7/2006 |

OTHER PUBLICATIONS

International Search Report issued Nov. 27, 2007 in PCT/JP2007/068112 which is the parent of the present application.

* cited by examiner

*Primary Examiner*—Nguyen T Ha
(74) *Attorney, Agent, or Firm*—Wenderoth, Lind & Ponack, L.L.P.

(57) ABSTRACT

A chip-type filter has a laminated body formed by stacking a plurality of capacitor elements, a pair of positive electrode terminals, a pair of negative electrode terminals, insulating outer resin, and an inductor section. The laminated body includes capacitor elements in a first group and capacitor elements in a second group, the positive electrode sections in both groups are disposed on the opposite sides with respect to the negative electrode sections. Positive electrode terminals are electrically connected to the positive electrode sections of capacitor elements in the first group and those of capacitor elements in the second group, respectively. Negative electrode terminals are electrically connected to the negative electrode sections in the laminated body, and are disposed at both ends of the direction crossing the connecting direction between the positive electrode terminals. The inductor section is insulated from the negative electrode sections and couples the positive electrode terminals.

14 Claims, 8 Drawing Sheets

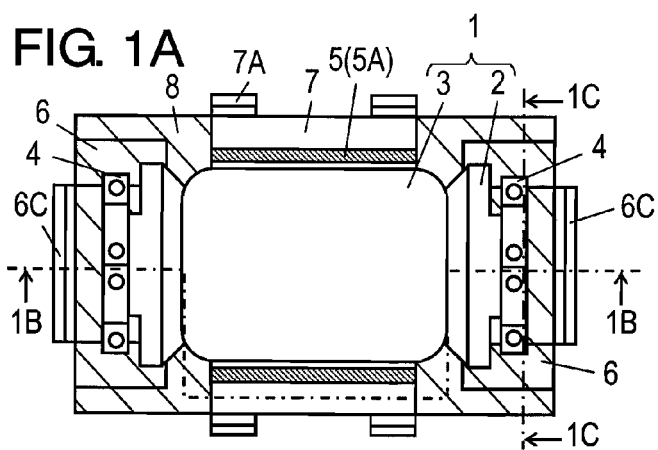
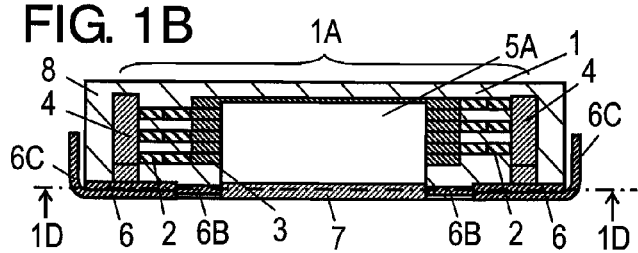
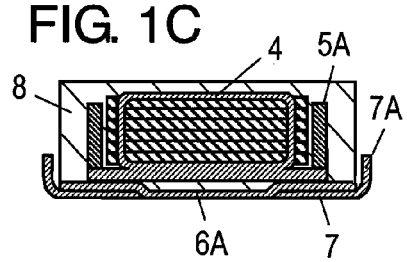
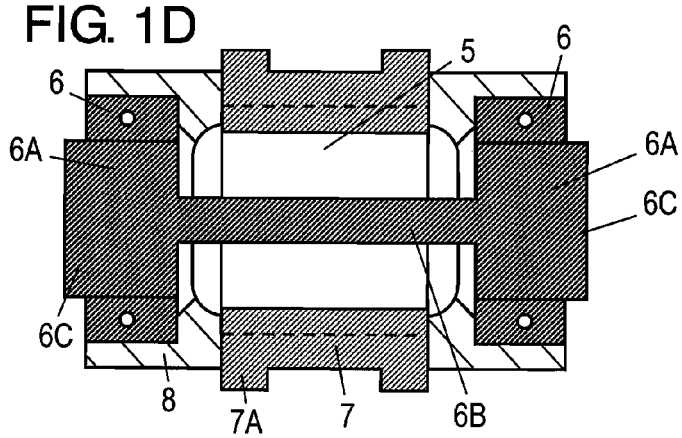
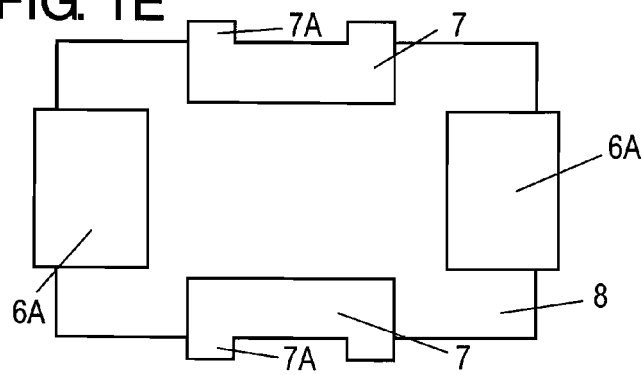

CHIP-TYPE FILTER

BACKGROUND OF THE INVENTION

1. Field of the Invention

The present invention relates to a chip-type filter that includes a chip-type solid electrolytic capacitor that contains conductive polymer as solid electrolyte and can be surface-mounted, and forms a π-type filter.

2. Background Art

In response to the increase in frequency of an electronic device, a capacitor as one of electronic components has been also demanded to have an impedance characteristic in a region of a frequency higher than that in a conventional capacitor. In order to reply such a demand, various solid electrolytic capacitors containing conductive polymer of high electric conductivity as solid electrolyte have been studied.

Recently, a solid electrolytic capacitor used in a periphery of a central processing unit (CPU) of a personal computer has been strongly demanded to be downsized and have large capacitance. Equivalent series resistance has been strongly demanded to be reduced (ESR reduction) in response to the increase in frequency, and equivalent series inductance has been strongly demanded to be reduced (ESL reduction) in order to reject noise and improve the transient responsibility. Various studies are performed in order to reply such demands.

FIG. 8A through FIG. 8D are a plan sectional view, a front sectional view, a bottom sectional view, and a bottom view showing a structure of a conventional chip-type solid electrolytic capacitor, respectively. Each of capacitor elements 21 has a positive electrode body (not shown) made of valve action metal. The surface of the positive electrode body is roughened, and then a dielectric oxide layer (not shown) is formed on the surface. An insulating section (not shown) is disposed at a predetermined position of the positive electrode body, and the positive electrode body is divided into positive electrode section 22 and a negative electrode-forming section (not shown). A solid electrolyte layer made of conductive polymer and a negative electrode layer made of carbon and silver paste (all are not shown) are sequentially formed in a stacking manner on the dielectric oxide layer of the negative electrode-forming section, thereby forming negative electrode section 23. Capacitor element 21 is formed in a flat plate shape.

Laminated body 24 is formed by stacking a plurality of capacitor elements 21 so that positive electrode sections 22 of capacitor elements 21 are disposed in the alternately opposite directions. Positive electrode lead frame 25 integrally joins positive electrode sections 22 in laminated body 24. Negative electrode lead frame 26 integrally joins negative electrode sections 23 in laminated body 24.

Positive electrode lead frame 25 is joined to the upper surface of positive electrode terminal 27. Thin sections 27B are disposed at both ends of the width direction in positive electrode terminal 27, and the center part other than thin sections 27B defines positive electrode terminal section 27A during mounting. Negative electrode lead frame 26 is joined to the upper surface of negative electrode terminal 28. Thin section 28B is disposed in a central part of the width direction in negative electrode terminal 28, and the both end parts other than thin section 28B define negative electrode terminal sections 28A during mounting.

Insulating outer resin 29 integrally covers laminated body 24, positive electrode lead frames 25, negative electrode lead frame 26, positive electrode terminals 27, and negative electrode terminals 28. Thin sections 27B and 28B respectively disposed in positive electrode terminals 27 and negative electrode terminals 28 are also integrally covered with outer resin 29. Positive electrode terminal sections 27A are disposed oppositely at two positions and negative electrode terminal sections 28A are disposed oppositely at two positions in the exposed state on the lower surface as the mounting surface of the chip-type solid electrolytic capacitor. In other words, this chip-type solid electrolytic capacitor has a four-terminal structure.

In the structured chip-type solid electrolytic capacitor, thanks to its four-terminal structure, magnetic fluxes generated by currents flowing between the terminals cancel each other. Therefore, the ESL can be significantly reduced. When the distance between the terminals is made as short as possible to decrease the loop area, the ESL can be further reduced.

However, even when such a solid electrolytic capacitor is used, in a π-type filter formed by connecting an external inductor element to it, extra resistance component or extra inductance component occurs in the connection path. As a result, the impedance increases.

SUMMARY OF THE INVENTION

The chip-type filter of the present invention has a laminated body formed by stacking a plurality of capacitor elements, a pair of positive electrode terminals, a pair of negative electrode terminals, insulating outer resin, and an inductor section. Each capacitor element has a positive electrode section and a negative electrode section, and the capacitor elements are stacked through the negative electrode sections. The laminated body includes capacitor elements belonging to a first group and capacitor elements belonging to a second group, the positive electrode sections in both groups are disposed on the opposite sides with respect to the negative electrode sections. Positive electrode terminals are electrically connected to the positive electrode sections of capacitor elements in the first group and those of capacitor elements in the second group, respectively. Negative electrode terminals are electrically connected to the negative electrode sections of the laminated body, and are disposed at both ends of the direction crossing the connecting direction between the positive electrode terminals. The outer resin covers the laminated body in a state where part of the positive electrode terminals and part of the negative electrode terminals are exposed. The inductor section is insulated from the negative electrode sections and couples the positive electrode terminals.

BRIEF DESCRIPTION OF DRAWINGS

FIG. 1A is a plan sectional view of a chip-type filter in accordance with an exemplary embodiment of the present invention.

FIG. 1B is a front sectional view of the chip-type filter shown in FIG. 1A.

FIG. 1C is a side sectional view of the chip-type filter shown in FIG. 1A.

FIG. 1D is a bottom sectional view of the chip-type filter shown in FIG. 1A.

FIG. 1E is a bottom view of the chip-type filter shown in FIG. 1A.

DETAILED DESCRIPTION OF THE INVENTION

Figure 1F:
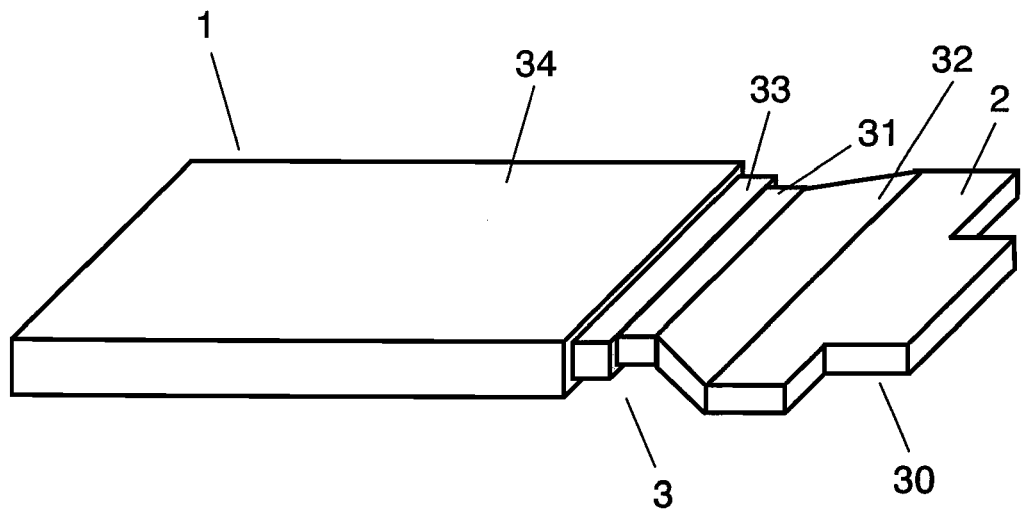
FIG. 1F is a partially cutaway perspective view of a capacitor element in the chip-type filter shown in FIG. 1A.

FIG. 1A through FIG. 1E show a structure of a chip-type filter in accordance with an exemplary embodiment of the present invention. FIG. 1A is a plan sectional view, FIG. 1B is a front sectional view taken in the line 1B-1B of FIG. 1A, FIG. 1C is a side sectional view taken in the line 1C-1C of FIG. 1A, FIG. 1D is a bottom sectional view taken in the line 1D-1D of FIG. 1B, and FIG. 1E is a bottom view. FIG. 1F is a partially cutaway perspective view of capacitor element 1 in the chip-type filter shown in FIG. 1A.

As shown in FIG. 1F, capacitor element 1 has positive electrode body 30 made of valve action metal such as aluminum. Insulating section 32 is disposed at a predetermined position of positive electrode body 30, and positive electrode body 30 is divided into positive electrode section 2 and a negative electrode-forming section (not shown). The surface of the negative electrode-forming section of positive electrode body 30 is roughened, and then dielectric oxide layer 31 is formed on the surface. Solid electrolyte layer 33 made of conductive polymer and negative electrode layer 34 made of carbon and silver paste are sequentially formed in a stacking manner on dielectric oxide layer 31, thereby forming negative electrode section 3. Capacitor element 1 has a flat plate shape.

As shown in FIG. 1B, a plurality of capacitor elements 1 are stacked through negative electrode sections 3 so that positive electrode sections 2 are disposed in the alternately opposite directions, thereby forming laminated body 1A. In other words, in FIG. 1A, capacitor elements 1 including positive electrode section 2 on the right side constitute a first group, and capacitor elements 1 including positive electrode section 2 on the left side constitute a second group. Positive electrode sections 2 of capacitor elements 1 in the first group are disposed on the opposite side to positive electrode sections 2 of capacitor elements 1 in the second group with respect to negative electrode sections 3. FIG. 1B shows the case where the number of capacitor elements 1 is six as an example, but the number is not limited. Each of the first group and second group may be formed of one or more capacitor elements 1.

As shown in FIG. 1A through FIG. 1C, a pair of positive electrode lead frames 4 integrally couple between positive electrode sections 2 positioned at both ends of laminated body 1A, respectively. More specifically, each positive electrode lead frame 4 is wound on the outer periphery of positive electrode sections 2 at each end, and couples positive electrode sections 2 by resistance welding or the like so as to bundle positive electrode sections 2. Negative electrode lead frame 5 is joined to the lower surface of negative electrode sections 3 positioned in the center of laminated body 1A through conductive silver paste (not shown). Guide walls 5A are disposed at both ends of negative electrode lead frame 5. More specifically, guide walls 5A are disposed at both ends of negative electrode lead frame 5 in the direction crossing the connecting direction between positive electrode terminals 6. The inner surfaces of guide walls 5A are electrically connected to negative electrode sections 3 through conductive silver paste.

As shown in FIG. 1A through FIG. 1D, positive electrode terminals 6 are joined to the lower surfaces of positive electrode lead frames 4, respectively. Parts of positive electrode terminals 6 are extended so as to project from outer resin 8 (described later) in the view from the top surface, and the extended parts are folded upward along the side surface of outer resin 8, thereby forming folded sections 6C. Positive electrode terminals 6 are electrically connected to positive electrode sections 2 of capacitor elements 1 in the first group and positive electrode sections 2 of capacitor elements 1 in the second group through positive electrode lead frames 4, respectively.

Plate-like inductor section 6B is insulated from negative electrode sections 3, and couples between terminal sections 6A. Inductor section 6B is made of metal such as copper, stainless steel, and nickel. Inductor section 6B may be made of the same material as positive electrode terminals 6.

A pair of negative electrode terminals 7 are joined to both ends of the lower surface of negative electrode lead frame 5. More specifically, negative electrode terminals 7 are electrically connected to negative electrode sections 3 positioned in the center of laminated body 1A through negative electrode lead frame 5, and are disposed at both ends in the direction crossing the connecting direction between positive electrode terminals 6, respectively. Parts of negative electrode terminals 7 are extended so as to project from outer resin 8 in the view from the top surface, and the extended parts are folded upward along the side surface of outer resin 8, thereby forming folded sections 7A.

Insulating outer resin 8 integrally covers laminated body 1A, positive electrode lead frames 4, negative electrode lead frame 5, parts of positive electrode terminals 6, and parts of negative electrode terminals 7. On the lower surface as the mounting surface, terminal sections 6A of positive electrode terminals 6 are exposed at two opposite positions, and negative electrode terminals 7 are exposed at two opposite positions. In other words, outer resin 8 covers laminated body 1A in a state where parts of at least the surfaces as the mounting surfaces of positive electrode terminals 6 and parts of at least the surfaces as the mounting surfaces of negative electrode terminals 7 are exposed.

Thus, this filter has a four-terminal structure. Inductor section 6B is covered with outer resin 8 and is not exposed to the outside.

Figure 1G:
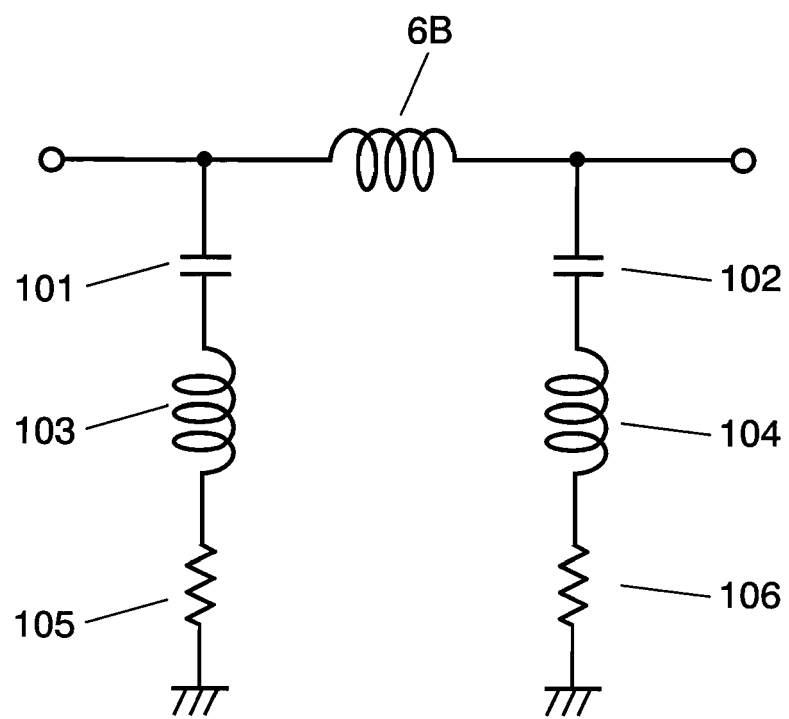
FIG. 1G shows an equivalent circuit of the chip-type filter shown in FIG. 1A.

In the chip-type filter of the present embodiment having such a structure, respective terminal sections 6A disposed in positive electrode terminals 6 are inter-coupled through inductor section 6B. FIG. 1G shows an equivalent circuit of this structure. Resultant capacitance 101 indicates the composite value of the capacitances of a plurality of capacitor elements 1 included in the first group where positive electrode sections 2 are disposed on the right side in FIG. 1A. Resultant capacitance 102 indicates the composite value of the capacitances of a plurality of capacitor elements 1 included in the second group where positive electrode sections 2 are disposed on the left side. The positive electrode sides of resultant capacitances 101 and 102 are connected to both ends of inductor section 6B, respectively. Thus, a π-type filter is formed.

When this filter is mounted, equivalent series inductance components 103 and 104 and equivalent series resistance components 105 and 106 originating in the connection path occur in series with resultant capacitances 101 and 102, respectively. In the present embodiment, however, inductor section 6B and laminated body 1A are built in one package and integrated. Therefore, equivalent series inductance components 103 and 104 and equivalent series resistance components 105 and 106 are smaller comparing with the case where a π-type filter is formed using the solid electrolytic capacitor and inductor element shown in FIG. 8A through FIG. 8D. Here, this filter has a structure similar to that of FIG. 1A through FIG. 1E. In addition, laminated body 1A is formed so that positive electrode sections 2 are disposed in the alternately opposite directions, and positive electrode terminals 6 are exposed at two opposite positions and negative electrode terminals 7 are exposed at two opposite positions on the mounting surface, thereby forming a four-terminal structure. Therefore, magnetic fluxes generated by currents between the terminals cancel each other, and hence equivalent series inductance components 103 and 104 are significantly reduced. As a result, in this filter, ESR reduction and ESL reduction can be achieved and the impedance can be reduced.

Parts of positive electrode terminals 6 and negative electrode terminals 7 are extended, and are folded upward along the side surface of outer resin 8, thereby forming folded sections 6C and 7A. Thanks to this structure, not only a soldering fillet is easily formed during soldering work, but also the soldering state can be recognized from the upside. Therefore, the reliability of the soldering work is improved.

In the present embodiment, the example where laminated body 1A is formed by stacking six capacitor elements 1 is described. However, the present invention is not limited to this. The number of stacked capacitor elements 1 may be appropriately determined in response to a desired specification, and may be odd. However, it is more preferable that the number is even. That is because the magnetic fluxes generated by currents flowing in respective capacitor elements 1 can cancel each other. In the present embodiment, laminated body 1A is formed so that positive electrode sections 2 are disposed in the alternately opposite directions. However, the present invention is not limited to this. Laminated body 1A may be formed so that positive electrode sections 2 are disposed in opposite directions in a random fashion. However, it is preferable that laminated body 1A is formed so that positive electrode sections 2 are disposed in the alternately opposite directions. That is because current paths flowing in capacitor elements 1 become more symmetric and hence the magnetic fluxes cancel each other more effectively.

In the present embodiment, inductor section 6B is disposed on the mounting surface side as the downside of laminated body 1A. However, the present invention is not limited to this. As long as inductor section 6B is disposed so as to be insulated from negative electrode sections 3 of capacitor elements 1 and couple between positive electrode terminals 6, inductor section 6B may be disposed above laminated body 1A or may be disposed between capacitor elements 1. Also in these cases, inductor section 6B is buried in outer resin 8.

It is preferable that inductor section 6B and positive electrode terminals 6 are integrally formed. Therefore, equivalent series inductance components 103 and 104 and equivalent series resistance components 105 and 106 are further reduced.

Figure 2:
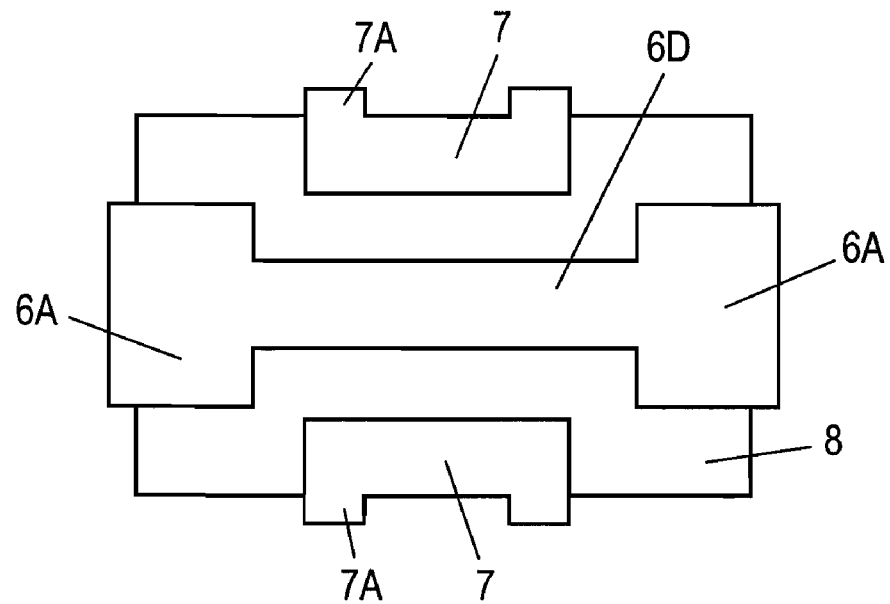
FIG. 2 is a bottom view of another chip-type filter in accordance with the exemplary embodiment of the present invention.

Next, a chip-type filter having a structure different from that shown in FIG. 1A through FIG. 1E is described. FIG. 2 is a bottom view of another chip-type filter in accordance with the exemplary embodiment of the present invention. This structure differs from the structure in FIG. 1E in that part of inductor section 6D is exposed on the lower surface as the mounting surface. Also in this case, part of inductor section 6D is buried in outer resin 8. In other words, the opposite side of the exposed surface of inductor section 6D is buried in outer resin 8. The other basic elements are similar to those of FIG. 1A through FIG. 1E.

Inductor section 6D is exposed in this structure, so that heat radiation is improved. When positive electrode terminals 6 and inductor section 6D are integrally formed, terminal sections 6A and inductor section 6D form the same plane. Therefore, inductor section 6D is formed more easily than inductor section 6B. For example, when inductor section 6B is formed by etching metal material, the upper and lower surfaces of the material are required to be etched. On the other hand, when inductor section 6D is formed, only the upper surface is required to be etched, hence the thickness can be controlled precisely, and the process can be simplified. While, when whole inductor section 6B is buried in outer resin 8 as in FIG. 1E, long-term reliability against influence of an external magnetic field and environmental impact is high.

Figure 3:
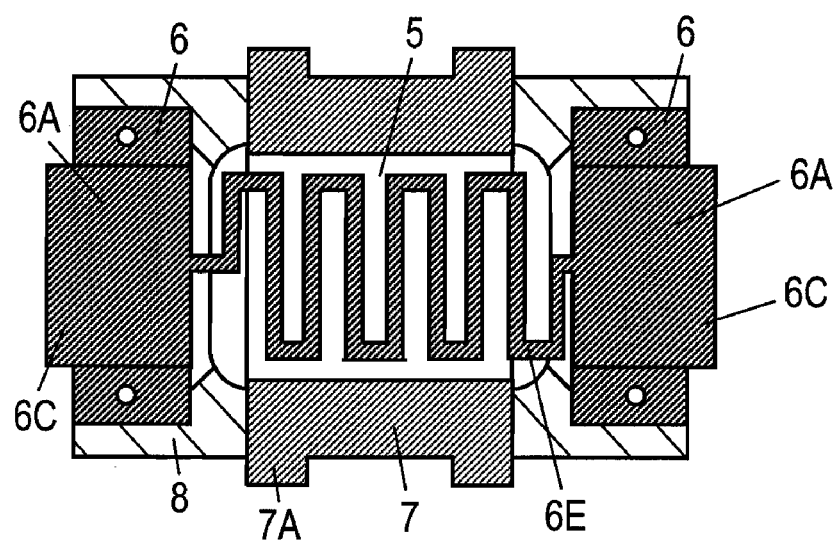
FIG. 3 is a bottom sectional view of yet another chip-type filter in accordance with the exemplary embodiment of the present invention.

Next, a chip-type filter having a further different structure is described. FIG. 3 is a bottom sectional view of yet another chip-type filter in accordance with the exemplary embodiment of the present invention. This structure differs from the structure in FIG. 1D in that inductor section 6E has a meandering shape. The other basic elements are similar to those of FIG. 1A through FIG. 1E.

In this structure, forming inductor section 6E having the meandering shape increases the degree of freedom in varying the inductance value of inductor section 6E. Therefore, the impedance value can be easily controlled.

Inductor section 6E has a rectangular meandering shape in FIG. 3; however, it may have a curved meandering shape. Alternatively, instead of the meandering shape, double spirals may be interconnected on one plane, or double spirals may be disposed on different planes and interconnected, for example. In other words, inductor section 6E can be made so that the current path of inductor section 6E is longer than the distance between positive electrode terminals 6.

Figure 4:
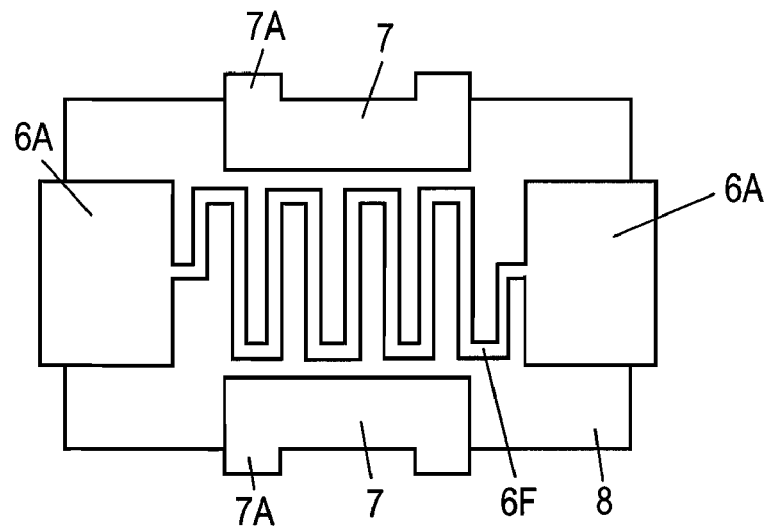
FIG. 4 is a bottom view of still another chip-type filter in accordance with the exemplary embodiment of the present invention.

As shown in FIG. 4, inductor section 6F having a meandering shape may be exposed on the lower surface as the mounting surface similarly to the structure of FIG. 2. This structure produces not only the effect of the structure of FIG. 3 but also the effect of the structure of FIG. 2.

Figure 5:
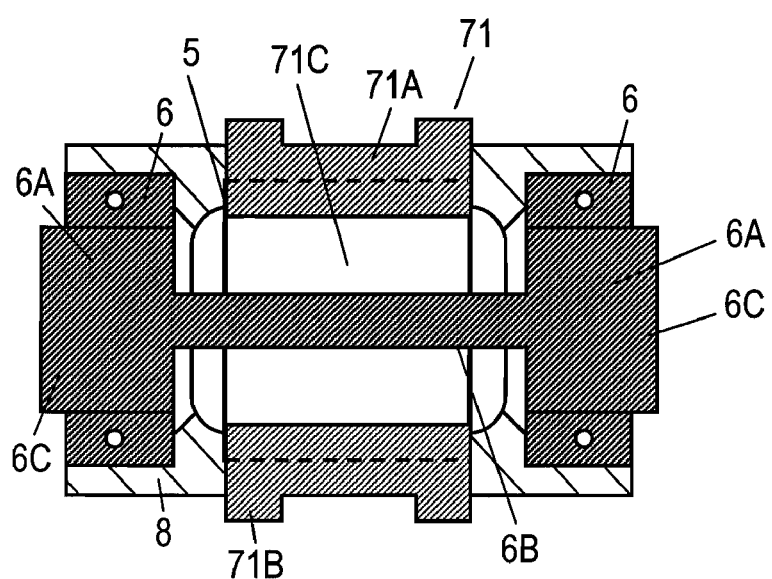
FIG. 5 is a bottom sectional view of still another chip-type filter in accordance with the exemplary embodiment of the present invention.

Next, a chip-type filter having a further different structure is described. FIG. 5 is a bottom sectional view of still another chip-type filter in accordance with the exemplary embodiment of the present invention.

This structure differs from the structure in FIG. 1D in that negative electrode terminal 71 is formed as a unified product of a pair of terminal sections 71A, folded sections 71B, and coupling section 71C. Coupling section 71C is joined to the lower surface of negative electrode lead frame 5. Each of folded sections 71B is formed by an extending part of negative electrode terminal 71 so as to project from outer resin 8 in the view from the top surface, and by folding this extended part upward along the side surface of outer resin 8. Coupling section 71C is formed by folding negative electrode terminal 71. The other basic elements are similar to those of FIG. 1A through FIG. 1E. This structure can reduce the number of components and the assembling man-hour.

Figure 6A:
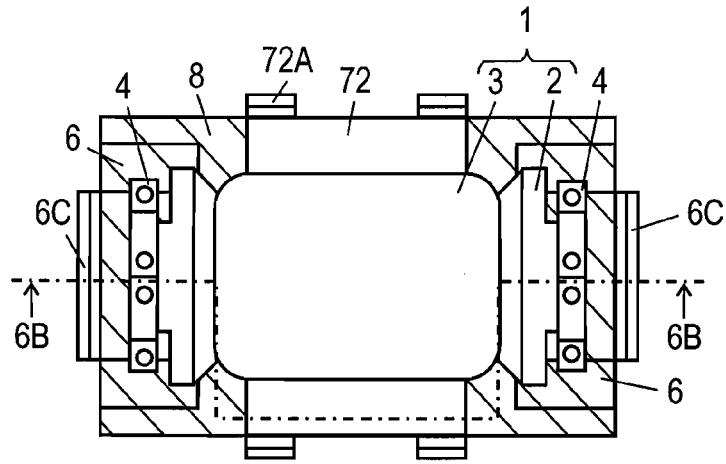
FIG. 6A is a plan sectional view of still another chip-type filter in accordance with the exemplary embodiment of the present invention.
Figure 6B:
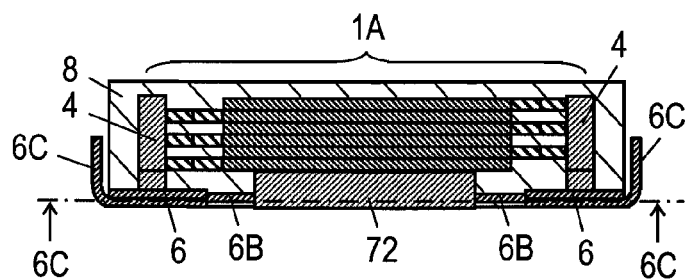
FIG. 6B is a front sectional view of the chip-type filter shown in FIG. 6A.
Figure 6C:
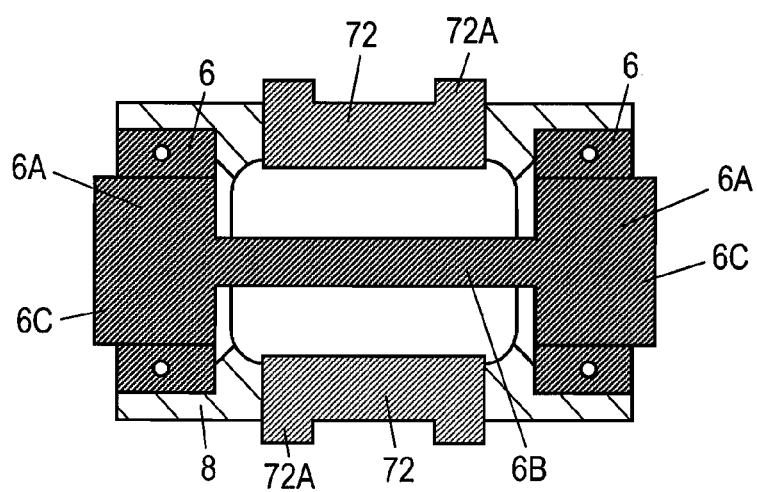
FIG. 6C is a bottom sectional view of the chip-type filter shown in FIG. 6A.

Next, a chip-type filter having a further different structure is described. FIG. 6A is a plan sectional view of still another chip-type filter in accordance with the exemplary embodiment of the present invention. FIG. 6B is a front sectional view taken in the line 6B-6B of FIG. 6A. FIG. 6C is a bottom sectional view taken in the line 6C-6C of FIG. 6B. In this structure, a pair of negative electrode terminals 72 are directly joined to both ends of the lower surface of negative electrode section 3 positioned in the center of laminated body 1A. Parts of negative electrode terminals 72 are extended so as to project from outer resin 8 in the view from the top surface, and the extended parts are folded upward along the side surface of outer resin 8, thereby forming folded sections 72A. The other basic elements are similar to those of FIG. 1A through FIG. 1E. This structure does not include negative electrode lead frame 5, so that the number of components and the assembling man-hour can be reduced. In addition, the connection path becomes shorter, so that unexpected equivalent series inductance components 103 and 104 and equivalent series resistance components 105 and 106 can be reduced.

While not shown, positive electrode sections 2 may be directly connected to positive electrode terminals 6 without using positive electrode lead frame 4. In other words, positive electrode sections 2 may be directly connected by resistance welding or the like. Also in this case, the number of components can be reduced and the connection path becomes shorter, so that unexpected equivalent series inductance components 103 and 104 and equivalent series resistance components 105 and 106 can be reduced.

As shown in FIG. 1A through FIG. 1C, however, using positive electrode lead frame 4 and negative electrode lead frame 5 having guide wall 5A facilitates stacking and connection of capacitor elements 1.

The structure shown in FIG. 5 where negative electrode terminal 71 has a pair of terminal sections 71A and coupling section 71C may be combined with the structure of FIG. 2 where inductor section 6D is exposed. The structure of FIG. 5 may be combined with the structure of FIG. 3 having meandering-shaped inductor section 6E. The structure of FIG. 5 may be combined with the structure of FIG. 4 where meandering-shaped inductor section 6F is exposed. In all cases, the effects of both structures are compatible with each other.

The structure of FIG. 6A through FIG. 6C where negative electrode terminals 72 are directly joined to both ends of negative electrode section 3, respectively, may be combined with the structure of FIG. 2 where inductor section 6D is exposed. The structure of FIG. 6A through FIG. 6C may be combined with the structure of FIG. 3 having meandering-shaped inductor section 6E. The structure of FIG. 6A through FIG. 6C may be combined with the structure of FIG. 4 where meandering-shaped inductor section 6F is exposed. In all cases, the effects of both structures are compatible with each other. Thus, by combining the structures specific to the drawings of the present embodiment, respective effects can be compatible with each other.

Figures 7A, 7B, 7C, 7D:
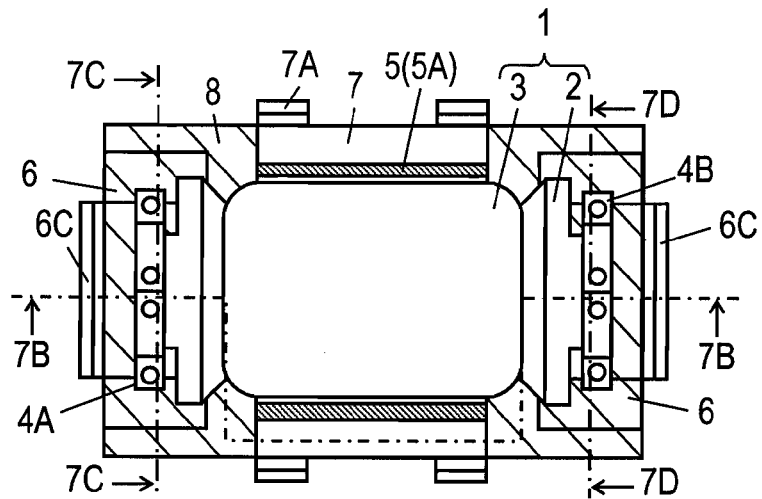
FIG. 7A is a plan sectional view of still another chip-type filter in accordance with the exemplary embodiment of the present invention.
FIG. 7B is a front sectional view of the chip-type filter shown in FIG. 7A.
FIG. 7C is a side sectional view taken in the line 7C-7C of the chip-type filter shown in FIG. 7A.
FIG. 7D is a side sectional view taken in the line 7D-7D of the chip-type filter shown in FIG. 7A.
Figure 7E:
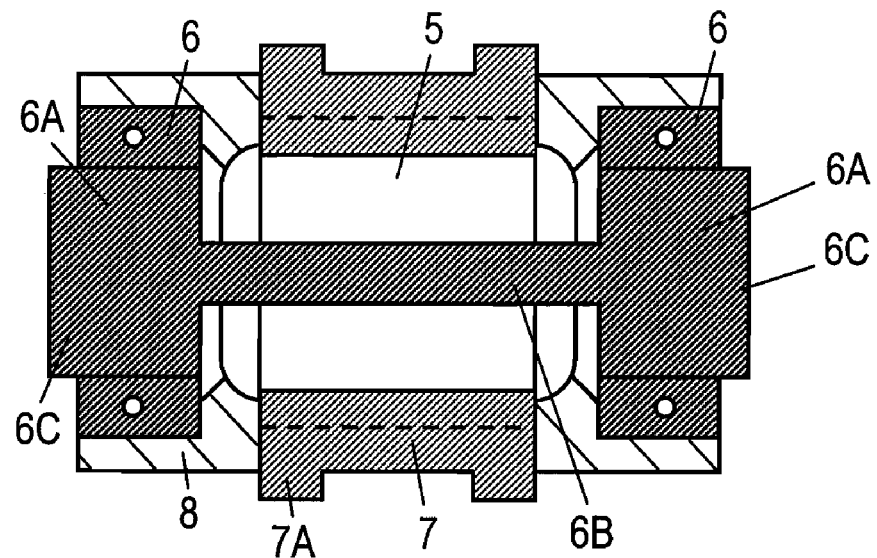
FIG. 7E is a bottom sectional view of the chip-type filter shown in FIG. 7A.
Figure 7F:
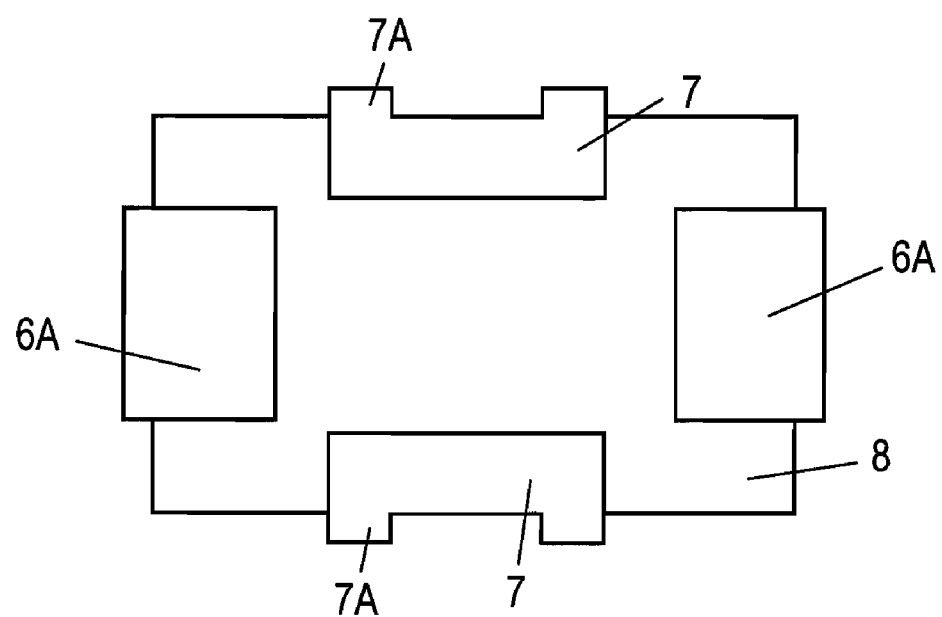
FIG. 7F is a bottom view of the chip-type filter shown in FIG. 7A.
Figure 8A:
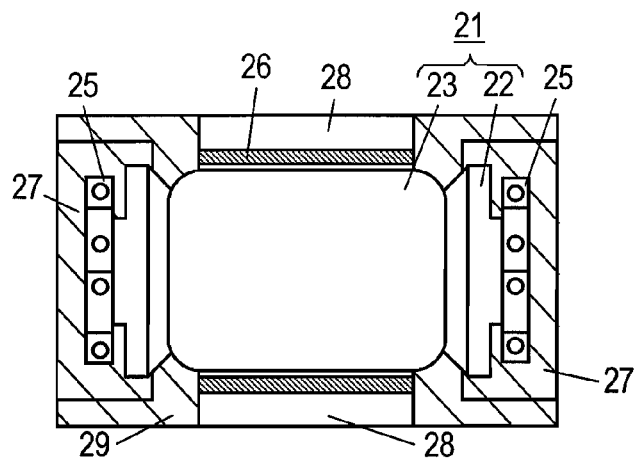
FIG. 8A is a plan sectional view of a conventional chip-type solid electrolytic capacitor.
Figure 8B:
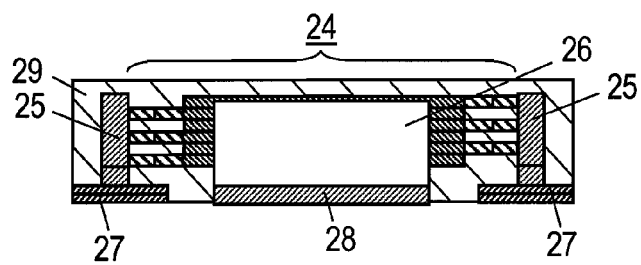
FIG. 8B is a front sectional view of the chip-type solid electrolytic capacitor shown in FIG. 8A.
Figure 8C:
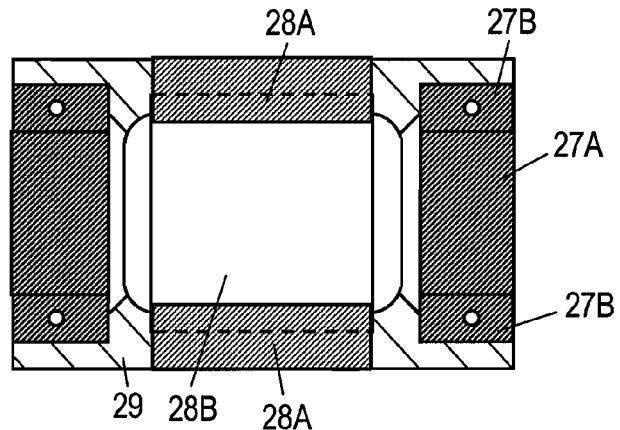
FIG. 8C is a bottom sectional view of the chip-type solid electrolytic capacitor shown in FIG. 8A.
Figure 8D:
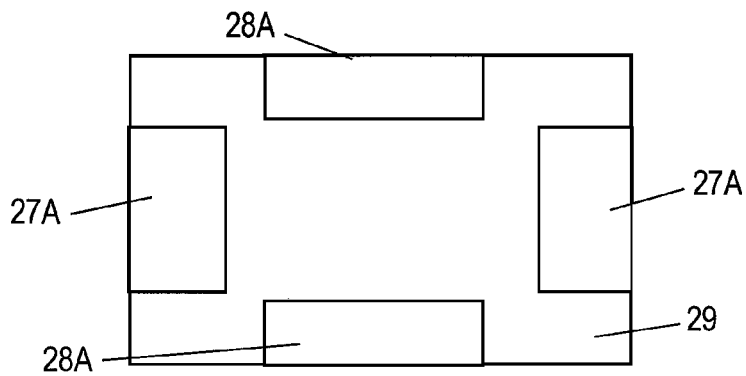
FIG. 8D is a bottom view of the chip-type solid electrolytic capacitor shown in FIG. 8A.

Next, a structure having different laminated body 1A is described. FIG. 7A through FIG. 7F show still another chip-type filter in accordance with the exemplary embodiment of the present invention. FIG. 7A is a plan sectional view of the filter. FIG. 7B is a front sectional view taken in the line 7B-7B of FIG. 7A. FIG. 7C is a left-side sectional view taken in the line 7C-7C of FIG. 7A. FIG. 7D is a right-side sectional view taken in the line 7D-7D of FIG. 7A. FIG. 7E is a bottom sectional view taken in the line 7E-7E of FIG. 7B. FIG. 7F is a bottom view.

In this structure, a plurality of capacitor elements 1 are aligned in the same direction and stacked to form element unit 41. In FIG. 7B through FIG. 7D, as an example, three capacitor elements 1 are stacked to form element unit 41. A plurality of element units 41 having such a structure are stacked so that positive electrode sections 2 are disposed in the alternately opposite directions. In FIG. 7B through FIG. 7D, as an example, two element units 41 are stacked. Thus, laminated body 1A is formed. In this case, capacitor elements 1 of upper element unit 41 form the first group, while capacitor elements 1 of lower element unit 41 form the second group. Positive electrode lead frames 4A and 4B are disposed so as to join positive electrode sections 2 to positive electrode terminals 6. They are joined by resistance welding or the like. Positive electrode lead frames 4A and 4B are not always required, positive electrode sections 2 may be directly coupled to positive electrode terminals 6. Stacking a plurality of capacitor elements 1 to form element unit 41 in this manner improves the workability and assembling precision.

In the present embodiment, the example where element unit 41 is formed by stacking three capacitor elements 1 is described. However, the present invention is not limited to this. The number of stacked capacitor elements 1 may be appropriately determined in response to a desired specification or workability. The number of stacked element units 41 may be odd. When the number of stacked element units is even, however, the magnetic fluxes generated by currents flowing in capacitor elements 1 can cancel each other. Accordingly, even-numbered element units are more preferable.

The structure of FIG. 7A through FIG. 7F where laminated body 1A is formed of a plurality of element units 41 may be combined with the structure of each of FIG. 2 through FIG. 6C. Two or more structures may be combined. In all cases, the effects of combined structures can be compatible with each other. Thus, by combining the structures specific to the drawings of the present embodiment, respective effects can be compatible with each other.

Next, a specifically evaluated result of the ESL characteristics of the chip-type filters of the present embodiment is shown in Table 1. The structure of each example is shown in Table 1. The length of negative electrode section 3 of capacitor element 1 used for the filter of each example is 4 mm, the width is 3 mm, the thickness is 0.15 mm, and the rated capacitance is 37 μF. Using six capacitor elements 1 having this specification, a filter where the length is 7.3 mm, width is 4.3 mm, thickness is 2.0 mm is formed. The length of inductor sections 6B and 6D is 5.3 mm, and the length of inductor sections 6E and 6F is 15.6 mm.

Table 1 also shows the measurement result of a comparative example (No. 25). The comparative example is a π-type filter formed by externally connecting the solid electrolytic capacitor having a structure shown in FIG. 8A through FIG. 8D to an inductor element.

TABLE 1

| No. | Including element unit | Inductor section linear/meandering | Inductor section exposed | Negative electrode lead frame presence or absence | Including coupling section | ESL average value X (pH) | ESL Dispersion R (pH) |
|---|---|---|---|---|---|---|---|
| 1 | No | linear | No | presence | No | 15 | 0.96 |
| 2 | No | linear | Yes | presence | No | 15 | 0.96 |
| 3 | No | meandering | No | presence | No | 11 | 0.63 |
| 4 | No | meandering | Yes | presence | No | 11 | 0.63 |
| 5 | No | linear | No | presence | Yes | 15 | 0.96 |
| 6 | No | linear | Yes | presence | Yes | 15 | 0.96 |
| 7 | No | meandering | No | presence | Yes | 11 | 0.63 |
| 8 | No | meandering | Yes | presence | Yes | 11 | 0.63 |
| 9 | No | linear | No | absence | — | 10 | 0.53 |
| 10 | No | linear | Yes | absence | — | 10 | 0.56 |
| 11 | No | meandering | No | absence | — | 8 | 0.48 |
| 12 | No | meandering | Yes | absence | — | 8 | 0.48 |
| 13 | No | linear | No | presence | No | 18 | 0.96 |
| 14 | Yes | linear | Yes | presence | No | 18 | 0.96 |
| 15 | Yes | meandering | No | presence | No | 14 | 0.63 |
| 16 | Yes | meandering | Yes | presence | No | 14 | 0.63 |
| 17 | Yes | linear | No | presence | Yes | 18 | 0.96 |
| 18 | Yes | linear | Yes | presence | Yes | 18 | 0.96 |
| 19 | Yes | meandering | No | presence | Yes | 14 | 0.63 |
| 20 | Yes | meandering | Yes | presence | Yes | 14 | 0.63 |
| 21 | Yes | linear | No | absence | — | 11 | 0.56 |
| 22 | Yes | linear | Yes | absence | — | 11 | 0.56 |
| 23 | Yes | meandering | No | absence | — | 9 | 0.48 |
| 24 | Yes | meandering | Yes | absence | — | 9 | 0.48 |
| 25 | No | — | | presence | No | 73 | 5.20 |

As is clear from Table 1, all of the chip-type filters of the present embodiment can reduce the ESL to ⅙ or lower of that of the conventional filter. Since the dispersion is small, the chip-type filters can also sufficiently respond to the recent and strong demand for high frequency applications.

When example No. 1 having the structure (linear inductor section 6B) of FIG. 1D is compared with example No. 3 having the structure (meandering-shaped inductor section 6E) of FIG. 3, the ESL of the latter is smaller. That is because the impedance of the high-frequency region can be reduced by increasing the inductance value of inductor section 6E. Similar relations are found between examples No. 2 and No. 4, between examples No. 5 and No. 7, and between examples No. 6 and No. 8.

When example No. 1 having the structure (including negative electrode lead frame 5) of FIG. 1A, FIG. 1B, and FIG. 1D is compared with example No. 9 having the structure (not including negative electrode lead frame 5) of FIG. 6A through FIG. 6C, the ESL of the latter is smaller. That is because using no negative electrode lead frame 5 allows unexpected equivalent series inductance to be reduced. Similar relations are found between examples No. 2 and No. 10, between examples No. 3 and No. 11, and between examples No. 4 and No. 12.

As described above, a chip-type filter of the present invention allows the ESR and ESL to be significantly reduced, hence has an effect of achieving impedance reduction, and is useful especially for a field or the like requiring the high-frequency responsiveness.

What is claimed is:

1. A chip-type filter comprising:
a laminated body including:
 a first group formed of at least one plate-shaped capacitor element having a positive electrode section and a negative electrode section; and
 a second group formed by stacking at least one plate-shaped capacitor element having a positive electrode section and a negative electrode section,
 wherein the negative electrode section of the capacitor element in the first group and the negative electrode section of the capacitor element in the second group are stacked, and the positive electrode section of the capacitor element in the first group is disposed on the opposite side to the positive electrode section of the capacitor element in the second group with respect to the negative electrode section;
a pair of positive electrode terminals electrically coupled to the positive electrode section of the capacitor element in the first group and the positive electrode section of the capacitor element in the second group, respectively;
a pair of negative electrode terminals electrically coupled to the negative electrode sections of the capacitor elements in the first group and the second group, the negative electrode terminals being disposed at both ends in a direction crossing a coupling direction between the pair of positive electrode terminals, respectively;
an insulating outer resin covering the laminated body in a state where parts of the positive electrode terminals and parts of the negative electrode terminals are exposed; and
an inductor section insulated from the negative electrode sections of the capacitor elements in the first group and the second group, the inductor section coupling the pair of positive electrode terminals.

2. The chip-type filter according to claim 1, wherein respective capacitor elements in the first group and respective capacitor elements in the second group are stacked alternately.

3. The chip-type filter according to claim 1, wherein
the capacitor elements in the first group and the capacitor elements in the second group are same in number.

4. The chip-type filter according to claim 1, wherein
the respective capacitor elements in the first group are directly stacked to form an element unit, and the respective capacitor elements in the second group are directly stacked to form another element unit, and
the element unit of the capacitor elements in the first group and the element unit of the capacitor elements in the second group are stacked to form the laminated body.

5. The chip-type filter according to claim 4, further comprising a positive electrode lead frames each bundling the positive electrode sections in each of the element units.

6. The chip-type filter according to claim 1, wherein
a part of the inductor section is exposed on a mounting surface of the chip-type filter.

7. The chip-type filter according to claim 1, wherein
a current path of the inductor section is longer than distance between the pair of positive electrode terminals.

8. The chip-type filter according to claim 1, wherein
the pair of negative electrode terminals are integrally formed through a coupling section disposed between the inductor section and the negative electrode sections.

9. The chip-type filter according to claim 1, further comprising a negative electrode lead frame joined to the negative electrode sections positioned in a center of the laminated body and joined to the pair of negative electrode terminals.

10. The chip-type filter according to claim 9, wherein
guide walls are disposed at both ends of the negative electrode lead frame in the direction crossing the coupling direction between the pair of positive electrode terminals, the guide walls being electrically coupled to the negative electrode sections.

11. The chip-type filter according to claim 1, wherein
the pair of negative electrode terminals are directly joined to the negative electrode sections.

12. The chip-type filter according to claim 1, further comprising a pair of positive electrode lead frames joined to the positive electrode sections so as to couple the positive electrode sections positioned at both ends of the laminated body, the positive electrode lead frames being coupled to the pair of terminal sections of the positive electrode terminals, respectively.

13. The chip-type filter according to claim 1, wherein
parts of the positive electrode terminals and parts of the negative electrode terminals are extended so as to project from the outer resin in the view from a top surface, and are folded upward along a side surface of the outer resin.

14. The chip-type filter according to claim 1, wherein
each of the capacitor elements has:
a positive electrode body made of valve action metal; and
an insulating section disposed on the positive electrode body, the insulating section dividing the positive electrode body into the positive electrode section and a negative electrode-forming section, and
the negative electrode section includes:
the negative electrode-forming section;
a dielectric oxide layer formed on the negative electrode-forming section;
a solid electrolyte layer formed on the dielectric oxide layer and made of a conductive polymer; and
a negative electrode layer formed on the solid electrolyte layer and made of carbon and silver paste.

* * * * *

UNITED STATES PATENT AND TRADEMARK OFFICE
CERTIFICATE OF CORRECTION

PATENT NO. : 7,612,987 B2  Page 1 of 1
APPLICATION NO. : 12/368569
DATED : November 3, 2009
INVENTOR(S) : Junichi Kurita et al.

It is certified that error appears in the above-identified patent and that said Letters Patent is hereby corrected as shown below:

• On the Title page of the patent:

In Section (63), under the "RELATED U.S. APPLICATION DATA" heading, please insert:
--Continuation of International Application No. PCT/JP2007/068112, filed on September 19, 2007.--

In Section (30), under the "FOREIGN APPLICATION PRIORITY DATA" heading, please insert the following foreign priority data:
--September 21, 2006 (JP) 2006-255589
October 18, 2006 (JP) 2006-283350--

• In column 1, line 2 (between the title "CHIP-TYPE FILTER" and the heading "BACKGROUND OF THE INVENTION"), please insert:
--This application is a continuation of International Application PCT/JP2007/068112, filed September 19, 2007.--

Signed and Sealed this

Second Day of February, 2010

David J. Kappos
*Director of the United States Patent and Trademark Office*